(12) United States Patent
Ouellet

(10) Patent No.: US 7,579,622 B2
(45) Date of Patent: Aug. 25, 2009

(54) FABRICATION OF MEMS DEVICES WITH SPIN-ON GLASS

(75) Inventor: Luc Ouellet, Granby (CA)

(73) Assignee: DALSA Semiconductor Inc., Waterloo, ON (CA)

(*) Notice: Subject to any disclaimer, the term of this patent is extended or adjusted under 35 U.S.C. 154(b) by 533 days.

(21) Appl. No.: 11/054,946

(22) Filed: Feb. 11, 2005

(65) Prior Publication Data
US 2005/0145962 A1 Jul. 7, 2005

Related U.S. Application Data

(62) Division of application No. 10/226,189, filed on Aug. 23, 2002, now Pat. No. 6,896,821.

(51) Int. Cl.
*H01L 29/04* (2006.01)
(52) U.S. Cl. .............. 257/65; 257/644; 257/E29.003; 438/662; 438/669; 438/672
(58) Field of Classification Search .............. 257/65, 257/644; 438/662, 669, 672
See application file for complete search history.

(56) References Cited

U.S. PATENT DOCUMENTS

| | | | |
|---|---|---|---|
| 5,364,818 A | 11/1994 | Ouellet | |
| 5,501,893 A | 3/1996 | Laermer et al. | |
| 5,670,423 A * | 9/1997 | Yoo | 438/587 |
| 5,937,275 A | 8/1999 | Munzel et al. | |
| 5,955,668 A | 9/1999 | Hsu et al. | |
| 6,559,040 B1 * | 5/2003 | Yu et al. | 438/585 |

FOREIGN PATENT DOCUMENTS

| | | |
|---|---|---|
| EP | 0 602 837 | 6/1994 |
| WO | WO 01/78096 | 10/2001 |

OTHER PUBLICATIONS

"Multi-level polysilicon surface-micromachining technology: applications and issues", Jeffrey J. Sniegowski.
"Chemical-mechanical polishing: enhancing the manufacturability of MEMS", Jeffry J. Sniegowski/.
"Material Safety Data Sheet", ACCUGLASS® P-112 A, P-114 A Spin-On Glass.
"Alcatel Vacuum Technology", AMS 200 I-Speeder, Deep Plasma Etching Systems.

* cited by examiner

*Primary Examiner*—Wai-Sing Louie
(74) *Attorney, Agent, or Firm*—Marks & Clerk; Richard J. Mitchell

(57) ABSTRACT

A method of making an etched structure in the fabrication of a MEMS device involves depositing a bulk layer, typically of polysilicon, prone to surface roughness. At least one layer of photo-insensitive spin-on planarizing material, such as silicate-based spin-on glass, is formed on the bulk layer to reduce surface roughness. This is patterned with a photoresist layer. A deep etch is then performed through the photoresist layer into the bulk layer. This technique results in much more precise etch structures.

10 Claims, 16 Drawing Sheets

Ideal situation: Photoresist not affected by surface roughness

Before polysilicon etch | After polysilicon etch

Rough surface situation: Photoresist affected by surface roughness

Before polysilicon etch | After polysilicon etch

- Exposed and developed photoresist
- Thick polysilicon
- Sacrificial material to be removed later on
- Substrate Surface roughness of the thick polysilicon after a first PEB Surface roughness of the thick polysilicon after a second PEB 6 : Polysilicon layer
9 : Photoresist layer

Before photoresist etch-back (A=B)

After photoresist etch-back (A'<B')

Thick polysilicon before and after PEB or

Sacrificial material

Topology such as underlying polysilicon patterns

Substrate under topology

Thick polysilicon    SOG

Thick polysilicon

FABRICATION OF MEMS DEVICES WITH SPIN-ON GLASS

CROSS REFERENCE TO RELATED APPLICATION

This application is a divisional application under 35 USC 121 of U.S. application Ser. No. 10/226,189 filed Aug. 23, 2002 now U.S. Pat. No. 6,896,821.

BACKGROUND OF THE INVENTION

1. Field of the Invention

This invention relates to the field of micro-device fabrication, and in particular to a method of a microstructure for use in the manufacture of MEMS (Micro-Electro-Mechanical-Systems) devices.

2. Description of Related Art

MEMS devices are becoming important in many applications. These devices mimic the functions of many mechanical devices on a microscopic scale. Typical examples of MEMS devices are micro-gyroscopes, micro-accelerometers, resonant accelerometers, micro-mirrors, micro-motors, micro-actuators micro optical switches. MEMS devices have at least one moving component to perform the mechanical function.

The manufacture of MEMS devices integrating at least one moving component typically requires the use of a stress-relieved polysilicon layer having a thickness range between 0.5 and about 40 µm. This must be precisely patterned with photoresist and precisely etched in a dry etcher capable of producing a vertical etch so as to achieve the required patterned stress-relieved polysilicon, which can be released from underlying sacrificial material. Unfortunately, a polysilicon layer of this thickness has a rough upper surface, which causes parasitic light scattering during photoresist exposure. This results in uncontrolled photoresist patterns and uncontrolled polysilicon patterns following polysilicon etch. To cope with this parasitic light scattering situation, chemical-mechanical-polishing (CMP), and/or photoresist etch-back (PEB) of the thick polysilicon layer have been used to reduce the surface roughness. Unfortunately, these two approaches are themselves associated with residual problems:

The CMP technique results in undesirable variations in the thickness of polysilicon over the underlying topology; requires a extra thicker polysilicon layer to be deposited in order to achieve the required nominal thickness after polishing, thus increasing cost; and requires costly equipment and consumables.

The PEB technique results in major undesirable variations in the thickness of polysilicon over the underlying topology; requires a thick polysilicon layer to be deposited in order to achieve the required nominal thickness following extensive photoresist etch-back, thus increasing processing cost; requires a thick, high-viscosity sacrificial photoresist to be coated and stabilized using a photoresist coater and other post-coating equipment; and requires the thick stabilized sacrificial photoresist to be etched-back at the same rate as the thicker-than-required polysilicon using an optimized etcher.

The polysilicon thickness variations and extra processing cost are undesirable for many of high precision and low-cost MEMS devices, particularly devices used for automotive applications, such as micro-accelerometers and micro-gyroscopes. These devices are very sensitive to polysilicon thickness since the sidewalls of the patterned thick polysilicon layer define electrodes of precision capacitors used for actuation and/or sensing elements.

The well characterised electrical, thermal, chemical and mechanical properties of silicon allow thick polysilicon to become the major building block of most MEMS devices manufactured today.

Thick polysilicon allows mechanical structures to be released from their underlying sacrificial material over large distances of the order of a few thousands of micrometers and suspended as millimetres-long micro-bridges acting as movement sensors for accelerometers or micro-gyros. An example of such a micro-gyro is described in U.S. Pat. No. 5,955,668 entitled 'Multi-element micro-gyro', which is herein incorporated by reference.

Unfortunately, polysilicon surface roughness increases rapidly with the deposited thickness of polysilicon and the resulting photoresist lithography is not without problems.

FIG. 1 shows the typical resulting surface roughness associated with various thicknesses of polysilicon deposited from the thermal decomposition of silane at 620° C. The surface roughness is measured by Atomic Force Microscopy (AFM). This shows that thicker polysilicon is associated with a rougher surface. Unfortunately, thicker polysilicon is also required for high performance MEMS devices.

Precision photoresist patterning is difficult on thick polysilicon because its rough surface is composed of a multitude of pyramids acting as micro-mirrors reflecting light in undesired directions.

FIG. 2 shows a typical three dimensional texture of the surface of an 11 µm thick polysilicon layer. This shows that this surface is covered by a series of pyramids of random height up to 1.5 µm or more.

Parasitic light reflection onto the surface of these randomly shaped pyramids causes undesirable randomly shaped photoresist patterns after exposure and development.

FIG. 3 shows the mechanism by which randomly shaped polysilicon lines are formed when photoresist is exposed over a thick polysilicon with a rough surface. It will be seen that the parasitic light reflection on the facets of the formed pyramids composing the rough surface of thick polysilicon layers of MEMS devices results in random photoresist lines and in random etched polysilicon lines. Two techniques have been developed to eliminate this photolithography problem in the fabrication of MEMS devices.

The first technique is disclosed in U.S. Pat. No. 5,937,275 entitled 'Method of producing acceleration sensors', the contents of which are herein incorporated by reference. This technique is shown in FIG. 4. A photoresist etch-back (PEB) process is used to eliminate the surface roughness of the thick polysilicon. The following sequence of steps must be carried out at least once and preferably twice so as to reduce the surface roughness of the thick deposited polysilicon layer sufficiently to produce controlled polysilicon patterns after an etch through the photoresist mask.

a) Deposit a thick polysilicon layer, resulting in a rough surface;
b) Coat with a thick photoresist layer, thus producing a smooth upper surface;
c) Etch-back the polysilicon at the same rate as the photoresist, thus reducing the surface roughness of the polysilicon;
d) Remove the photoresist.

The second technique is disclosed in the following cited reference from Jeffry J. Sniegowski: 'Chemical-mechanical polishing: enhancing the manufacturability of MEMS', SPIE Micromachinng and Microfabrication '96 Symposium, vol. 2879, Austin, Tex., Oct. 14-15, 1996, also published in: 'Multi-level polysilicon surface-micromachining technology, applications and issues', ASME 1996 International Mechanical Engineering Congress and Exposition, Nov. 17-22, 1996, Atlanta, Ga.

This second technique, shown in FIG. 5, involves the chemical-mechanical polishing (CMP) of thick polysilicon layers to reduce their surface roughness and allow precision photolithography and patterning.

As FIG. 6 shows, the reduction of the surface roughness of the thick polysilicon by machining its top surface by either one of these two prior art techniques (PEB or CMP) results in several drawbacks. The machining of the rough surface of the thick polysilicon results in an important and undesirable thickness variation of the thick polysilicon over underlying and patterned polysilicon layers (A'<B' in FIG. 6). This underlying topology is unavoidable in most cases because most MEMS devices incorporate underlying polysilicon patterns used as electrical interconnects or mechanical elements. This thickness variation has an undesirable major impact on MEMS devices design since varying the underlying layout results in a thickness variation of the thick polysilicon at locations where variations are not acceptable.

An extra thick layer of polysilicon must be deposited since its initial thickness (referred as A=B in FIG. 6) is substantially reduced to a much smaller final thickness (referred as A'<B' in FIG. 6) following PEB or CMP.

PEB requires a thick sacrificial photoresist to be etched-back once and probably more then once at the same rate as the thicker-than-required polysilicon using an etcher optimized for this application in order to transfer the smooth profile of the surface of photoresist into the etched-back polysilicon. CMP requires complex processing.

The local variation of thick polysilicon thickness following PEB or CMP is particularly important in the regions where the machined thick polysilicon covers underlying topology such as patterned polysilicon layers and the like. Depending upon the thickness of these underlying polysilicon layers and on the specifics of the PEB or CMP techniques, the thickness variation can approach the nominal thickness of the layer itself.

These local thickness variations are unacceptable for many MEMS devices using capacitance actuation such as micro-gyros, optical switches, micro-motors, micro-actuators and many other MEMS devices using thick polysilicon as electrode or mechanical element.

An example of such a MEMS requiring a uniformly thick polysilicon is described in the U.S. Pat. No. 5,955,668 titled 'Multi-element micro-gyro', which is herein incorporated by reference. The oscillating micro-gyro described in this patent is shown in FIG. 7. It requires capacitive actuation of the oscillation and capacitive sensing of the orthogonal oscillation produced by the Coriolis effect arising in the event of a rotation of the micro-gyro. The capacitors used for oscillation actuation are formed by the combination of a fixed thick polysilicon excitation vertical electrode and of a released neighbouring thick polysilicon responding vertical electrode. The capacitance of the oscillating actuation capacitor is then related to the surface area (i.e. height) of these two neighbouring thick polysilicon electrodes and to the oscillating gap (i.e. spacing) between these two neighbouring thick polysilicon electrodes. Any variation of the local thickness of the thick polysilicon results in an undesirable variation in the capacitance value and in the device performance. Similarly, any variation of the thick polysilicon line widths and spacings resulting from the parasitic light reflection on its rough surface will result in undesirable variation in the gaps between these two electrodes.

The PEB and CMP techniques used to machine the upper surface of the thick polysilicon minimize the variations of the thick polysilicon line widths and spacings and thus ensure reproducible line widths and spacings of the etched polysilicon. Unfortunately, these techniques do not prevent the local variations of local thickness of the thick polysilicon and thus result in undesirable variations in the activation and sense capacitors and in undesirable variations in actuation performance.

The process described in U.S. Pat. No. 5,364,818 entitled 'SOG with moisture resistant protective capping layer", the contents of which are herein incorporated by reference, has been used to level polysilicon and aluminum alloys interconnects in dielectrics of CMOS and other semiconductor devices.

SUMMARY OF THE INVENTION

In accordance with the invention, a temporary planarizing layer, preferably of spin-on glass (SOG), is inserted between the photoresist and the underlying thick polysilicon layer to be patterned to prevent parasitic light scattering from the underlying rough surface of the thick polysilicon. This allows simple and forgiving precision patterning of the underlying thick polysilicon without the associated variation of polysilicon thickness since the upper surface of the thick polysilicon does not need to be either etched-back or polished. This technique can result in lower cost and better performance MEMS devices.

According to the present invention there is provided a method of making an etched structure for use in the fabrication of a MEMS device, comprising the steps of depositing a bulk layer prone to surface roughness; forming at least one layer of photo-insensitive spin-on planarizing material on said bulk layer; patterning said planarizing material with a photoresist layer; and performing a deep etch through said photoresist layer into said bulk layer.

The invention discloses the novel use of one or multiple coats of SOG as a smoothing material directly coated onto a bulk layer, preferably polysilicon, whose thickness is higher than 0.5 µm, to reduce its microscopic roughness and allow the precise exposure of photoresist directly deposited onto the SOG to achieve precise lithography of the underlying thick polysilicon used in the manufacture of MEMS devices. While polysilicon is preferred as the bulk layer, the invention could be applied to other materials suitable for the manufacture of MEMS devices. The polysilicon should normally have a thickness in the range 0.5 µm to 100 µm.

The temporary SOG has prevents parasitic light scattering from the underlying rough surface of the thick polysilicon and allows simple and forgiving precision patterning of the underlying thick polysilicon without the associated variation of polysilicon thickness since the upper surface of the thick polysilicon is not etched-back nor polished in this SOG approach, thus resulting in lower cost and better performance MEMS devices.

The SOG is preferably a phosphorus-doped silicate spin-on glass, although other suitable materials can be employed.

The invention further provides a microstructure for use in the manufacture of a MEMS device, comprising a bulk layer having a rough surface; at least one layer of photo-insensitive spin-on planarizing material deposited on said bulk layer; a photoresist layer deposited on said planarizing material; and a deep etch trench extending through said photoresist layer into said bulk layer.

BRIEF DESCRIPTION OF THE DRAWINGS

The invention will now be described in more detail, by way of example only, with reference to the accompanying drawings, in which:—

DETAILED DESCRIPTION OF THE PREFERRED EMBODIMENTS

A typical process for fabricating a MEMS device requires at least one thick polysilicon layer, whose thickness ranges between 0.5 μm and 100 μm. This thick polysilicon layer must be stress relieved, patterned and released from its underlying material in order to perform its sensing and/or actuation function.

Two basic techniques are widely used to deposit thick polysilicon layers. In the first technique, the polysilicon layers are deposited over a sacrificial oxide in batch or single wafer epitaxial reactors operated at temperatures ranging between 1000 and 1200° C. from gas mixtures involving either dichlorosilane or trichlorosilane, phosphine, hydrogen and other gases. This technique results in very rough surface thick polysilicon onto sacrificial oxide;

In the second technique, Low Pressure Chemical Vapour Deposition, LPCVD, is used with vertical or horizontal tubes operated at temperatures ranging from 560° C. and 640° C. from gas mixtures involving silane, phosphine and other gases. At a high deposition rate and a temperature at the upper end of the range, this technique produces a thick polysilicon layer with a rough surface. At a lower deposition rate and temperature at the lower end of the range, this technique produces a thick silicon amorphous silicon layer having a lower surface roughness. Thick polysilicon is obtained in all cases following stress relief at a temperature of more than about 1000° C.

It is true that for both basic techniques, the thicker the thick polysilicon, the greater its surface roughness. This surface roughness prohibits the use of controlled lithography on the thick polysilicon.

In one example, the surface roughness was reduced by using a layer of Accuglass P-112A SOG.

Figure 1:
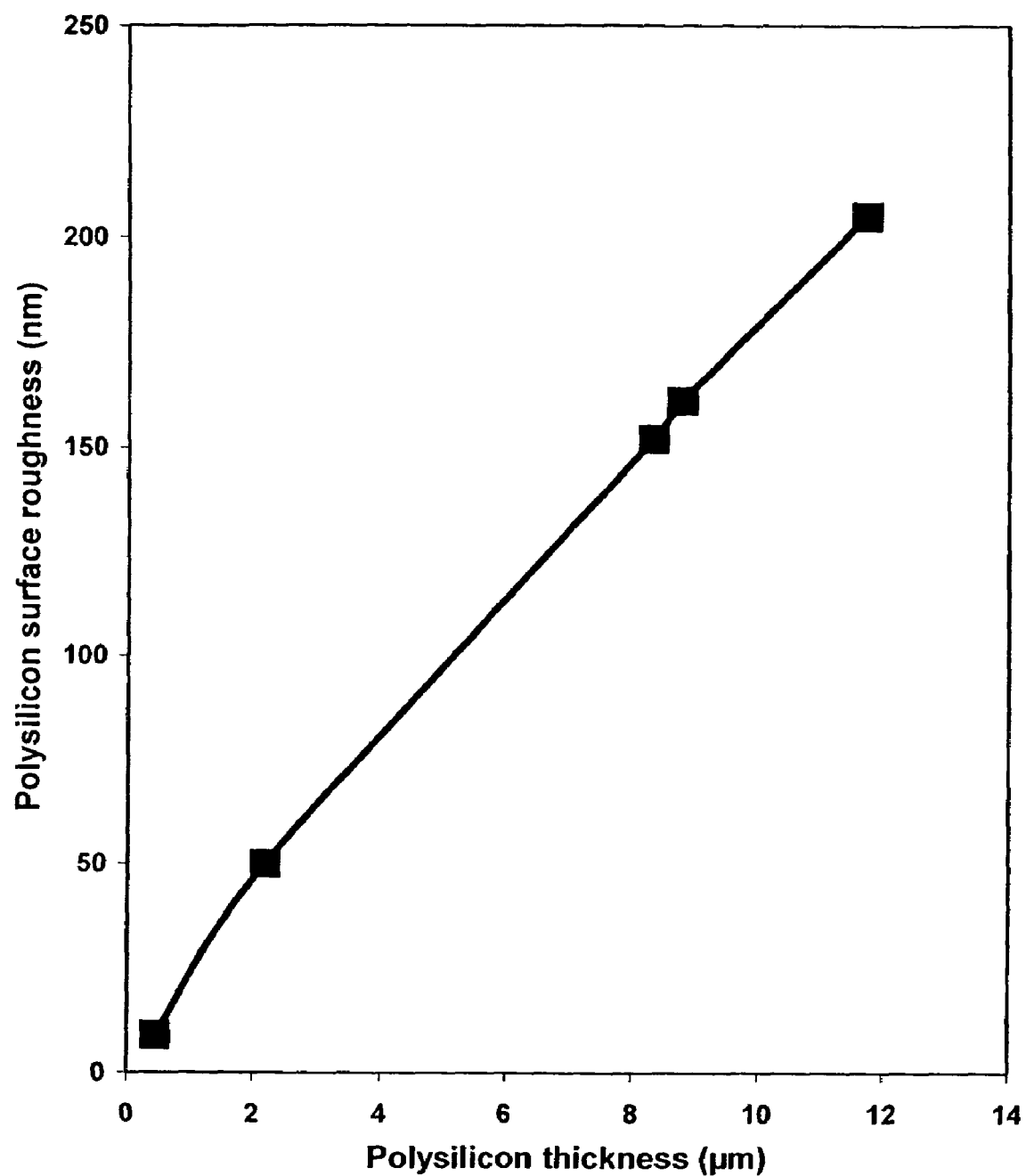
FIG. 1 is a plot of atomic force microscopy measurements of the surface roughness of various thick polysilicon.
Figure 2:
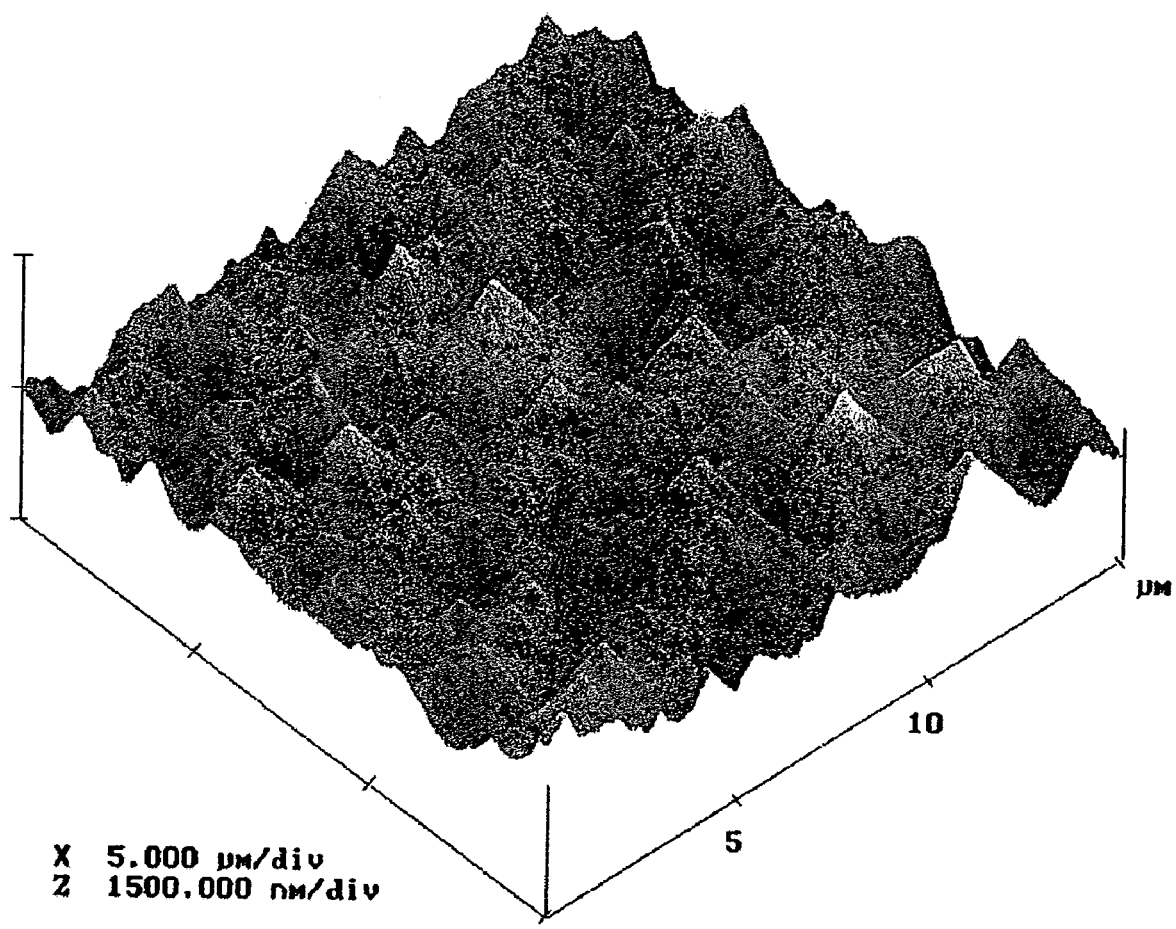
FIG. 2 shows a typical three dimensional texture of the surface of an 11 μm thick polysilicon, as measured by atomic force microscopy.
Figure 3:
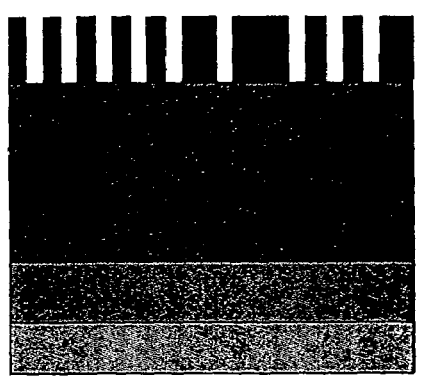
FIG. 3 is a cross-sectional view showing the formation of random shaped polysilicon lines when photoresist is exposed over rough surface polysilicon.
Figure 3:
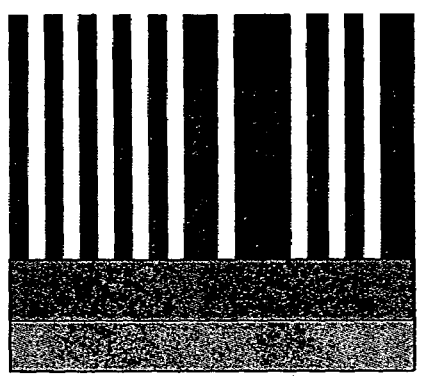
Figure 3:
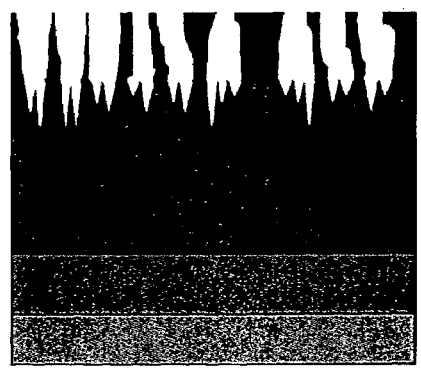
Figure 3:
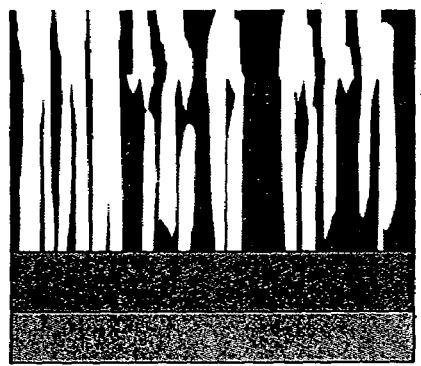
Figure 4:
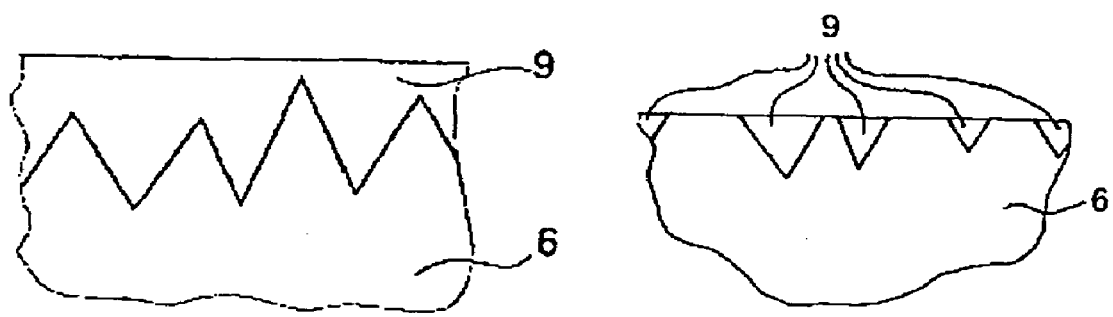
FIG. 4 is an example of the use of photoresist etch-back polishing of thick polysilicon in the fabrication of acceleration sensors (U.S. Pat. No. 5,937,275 from Robert Bosch GmbH.
Figure 4:
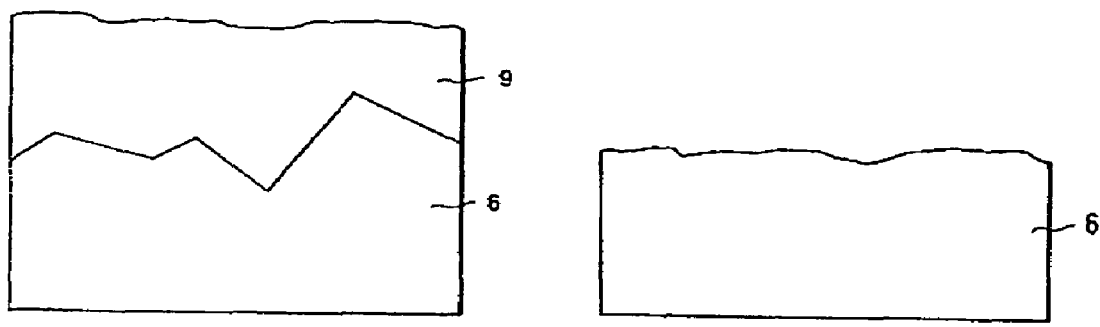
Figure 5:
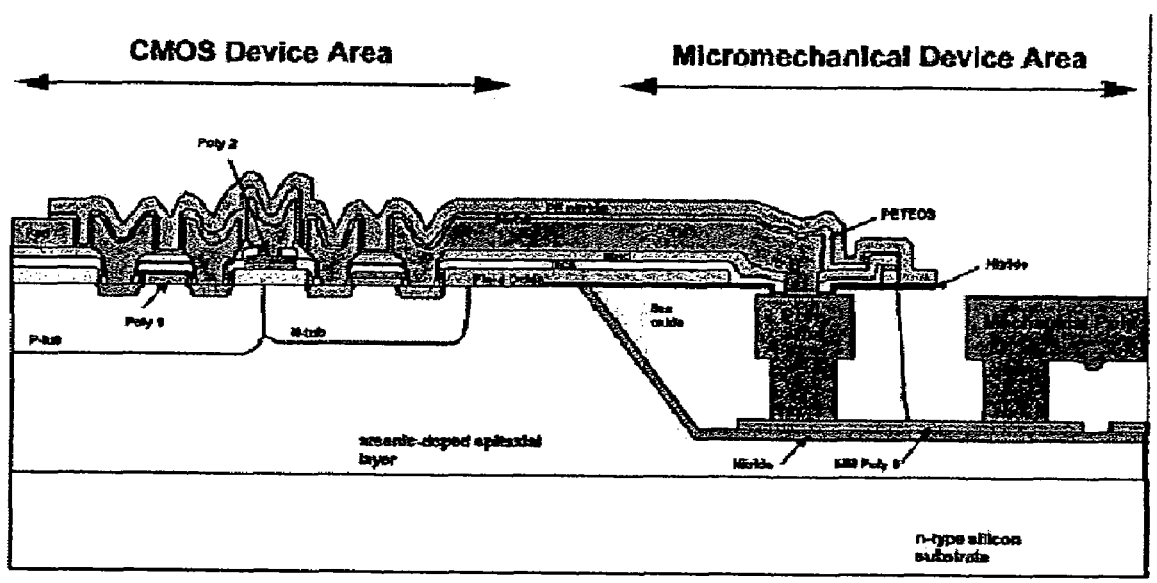
FIG. 5 is an example of the use of chemical-mechanical polishing of thick polysilicon in the fabrication of MEMS devices (Jeffry J. Sniegowski, Sandia National Laboratories, 1996.
Figure 6:
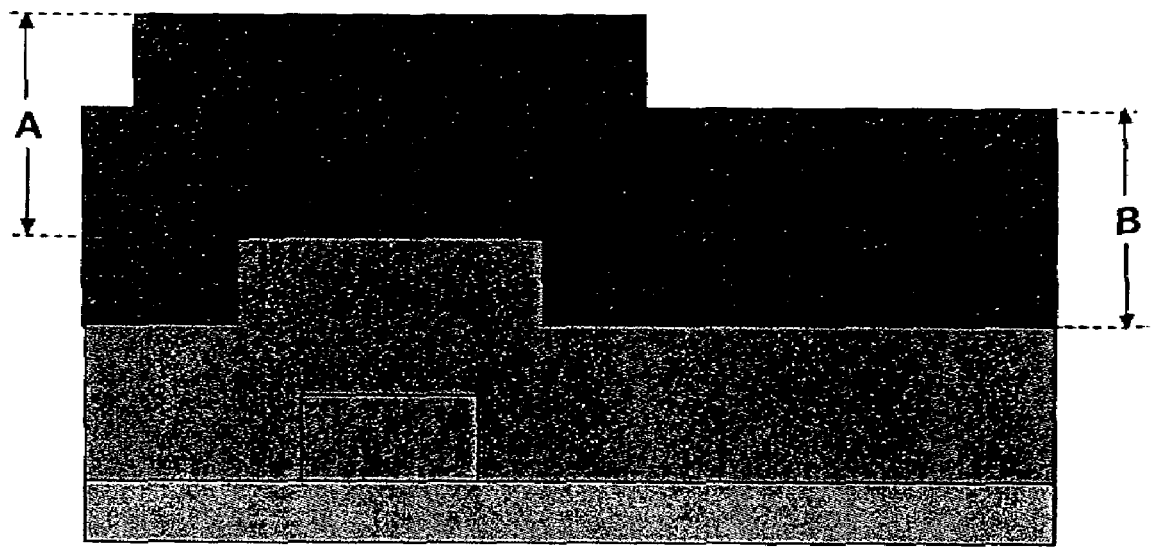
FIG. 6 shows the undesirable thickness variations of polysilicon over underlying topology following polysilicon machining by PEB or CMP.
Figure 6:
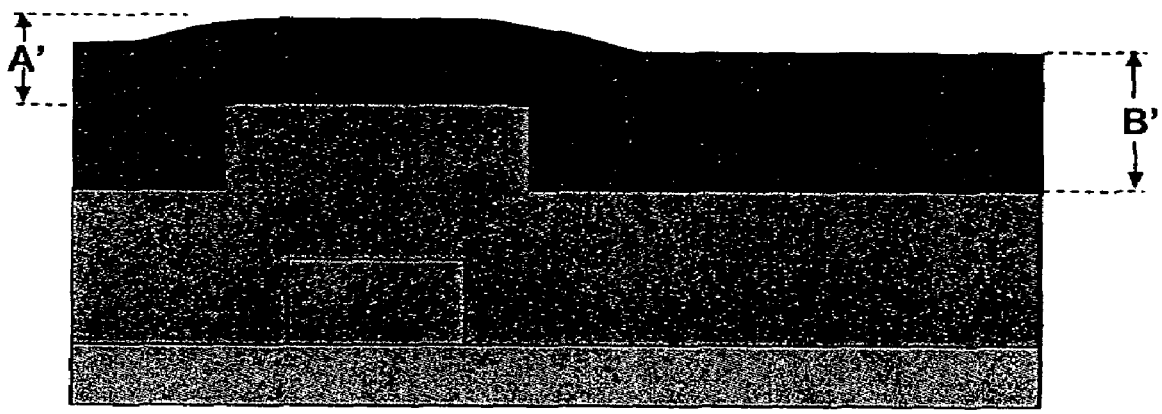
Figure 6:
Figure 6:
Figure 6:
Figure 6:
Figure 7:
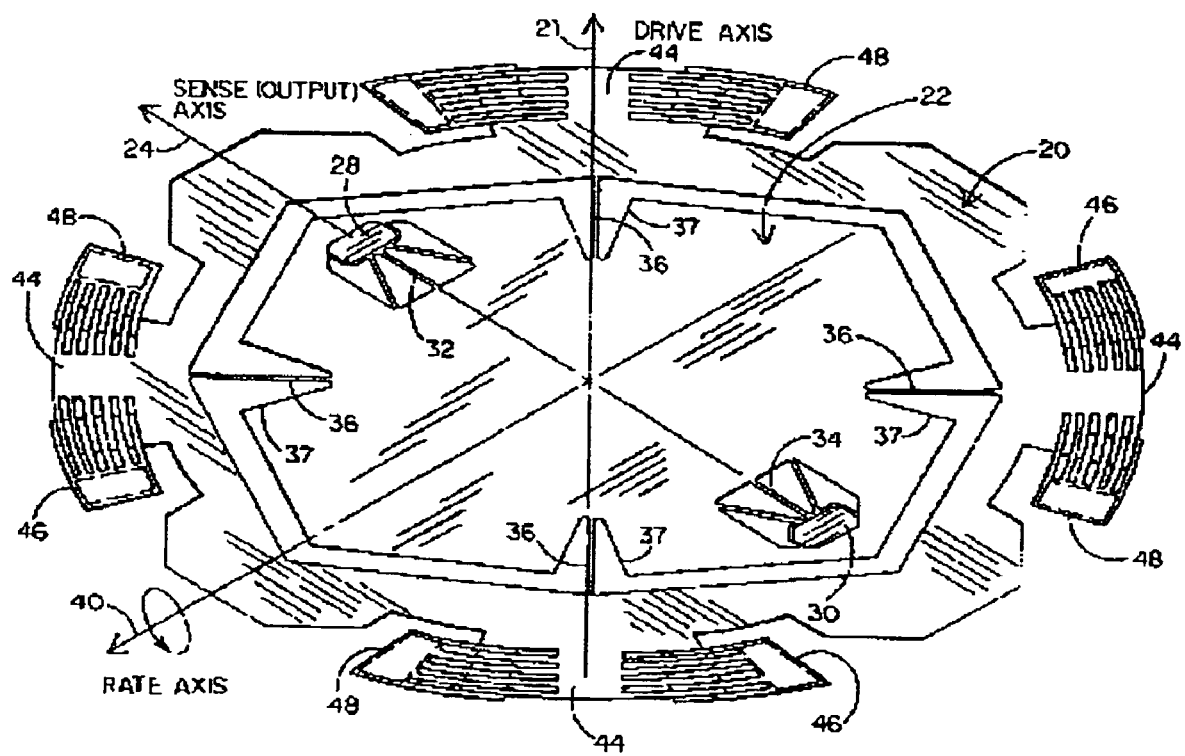
FIG. 7 illustrates a MEMS micro-gyro requiring a uniformly thick polysilicon (U.S. Pat. No. 5,955,668, Irvine Sensors Corporation.
Figure 7:
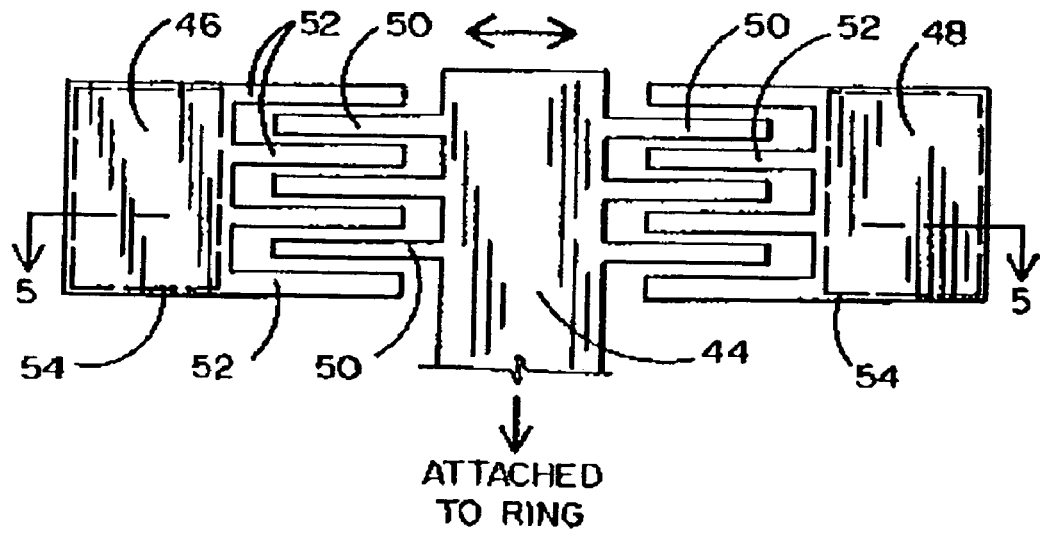
Figure 8:
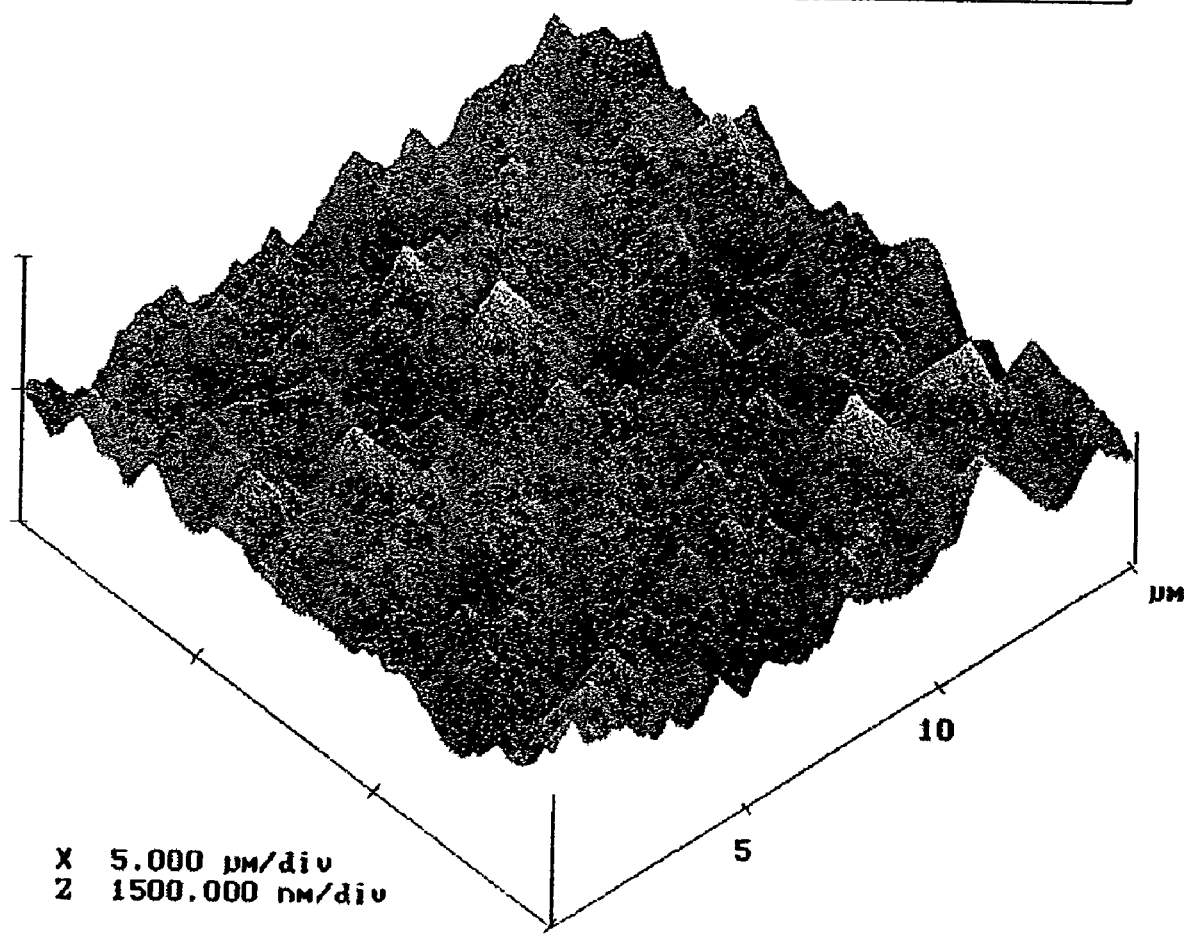
FIG. 8 shows the AFM surface roughness statistics of an 11 μm thick LPCVD polysilicon layer.

FIG. 8 shows the AFM surface roughness statistics for an 11 μm thick polysilicon deposited by LPCVD. It will be seen from FIG. 8 that that a layer having an RMS surface roughness of about 0.19 μm is associated with a random distribution of pyramids, some as high as 1.46 μm. A scanned geometrical surface having a nominal area of 225 $\mu m^2$ actually has a 29% larger physical surface area of 291 $\mu m^2$ due to the presence of the pyramids. This rough surface is prone to light scattering and will result in rough photoresist and thick polysilicon lines.

Figure 9:
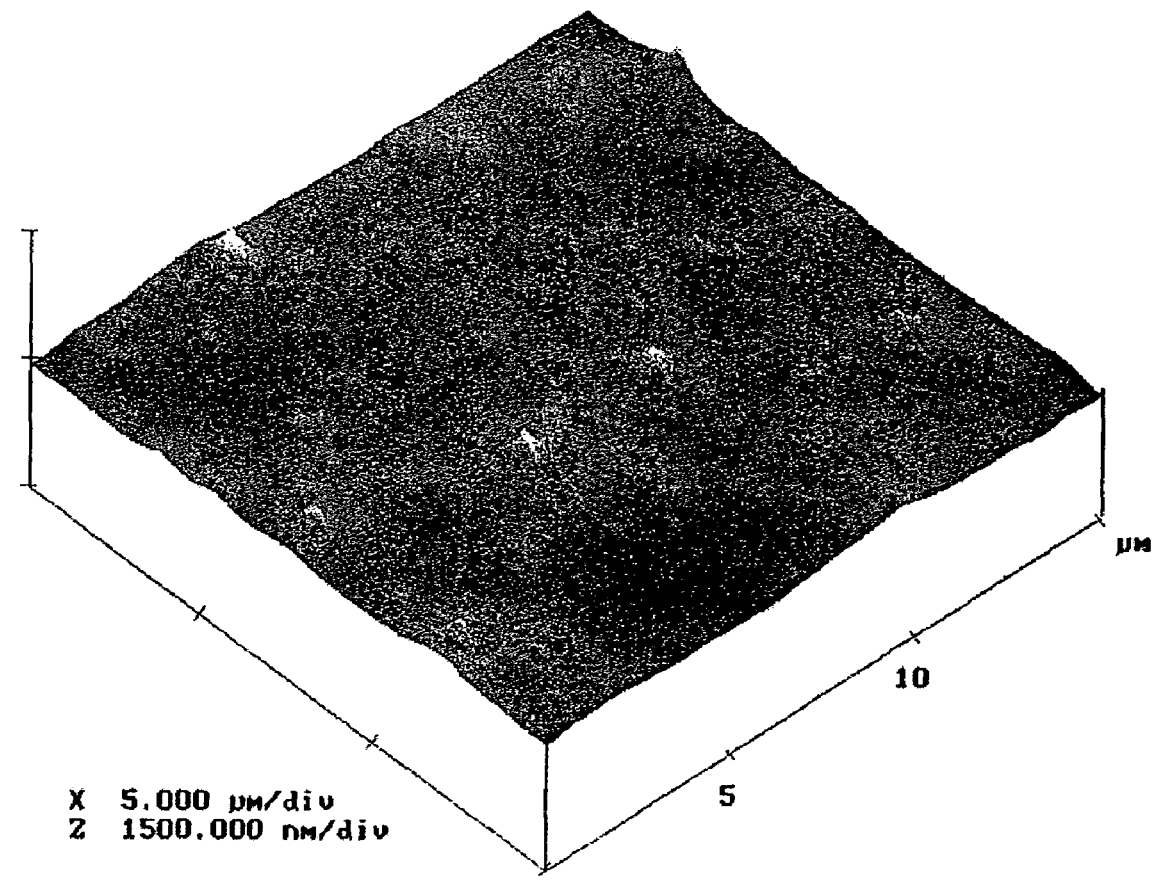
FIG. 9 shows the AFM surface roughness statistics of an 11 μm thick LPCVD polysilicon layer covered with four coats of P-112 SOG.

FIG. 9 shows the AFM surface roughness statistics for the same 11 μm thick polysilicon wafer coated at 3000 RPM with four coats of a phosphosilicate polymer called Accuglass P-112A and available from Honeywell International. It will be observer that these four coats of SOG have reduced the RMS surface roughness from 0.19 μm to about 0.05 μm and the maximum height pyramids from 1.46 μm to 0.55 μm. Moreover, the physical surface area of the 225 $\mu m^2$ geometrical surface area has been reduced from 291 $\mu m^2$ to 229 $\mu m^2$, i.e. only 1.78% larger then the geometrical surface area. This much smoother surface obtained with the SOG should then be free of parasitic light scattering and should result in a well controlled photoresist and thick polysilicon lithography.

Figure 10:
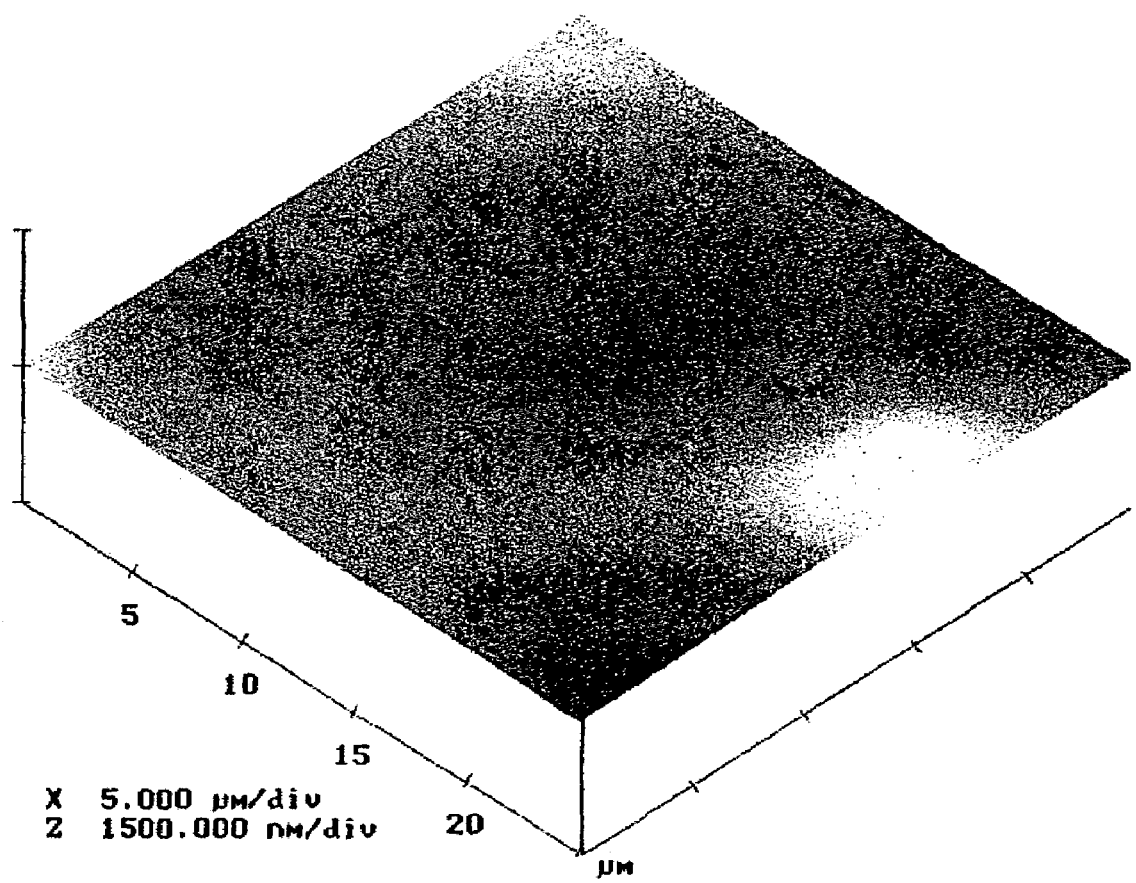
FIG. 10 shows the AFM surface roughness statistics of an 11 μm thick LPCVD polysilicon layer covered with 4 coats of P-112 SOG and covered with the photoresist.

FIG. 10 shows the AFM surface roughness statistics for the same 11 μm thick polysilicon wafer coated with Accuglass P-112A and with a 2 μm thick photoresist. It is seen that the RMS surface roughness of about 0.19 μm has been further reduced to about 0.017 μm and that the maximum height pyramids of 1.46 μm have been further reduced to a negligible 0.097 μm. More importantly, a physical surface area of a 625.00 $\mu m^2$ geometrical surface area has further been reduced to only 625.02 $\mu m^2$, thus only 0.004% larger then the geometrical surface area. This extremely smooth surface should be free from parasitic light scattering and should result in a well controlled photoresist and thick polysilicon lithography.

Figure 11:
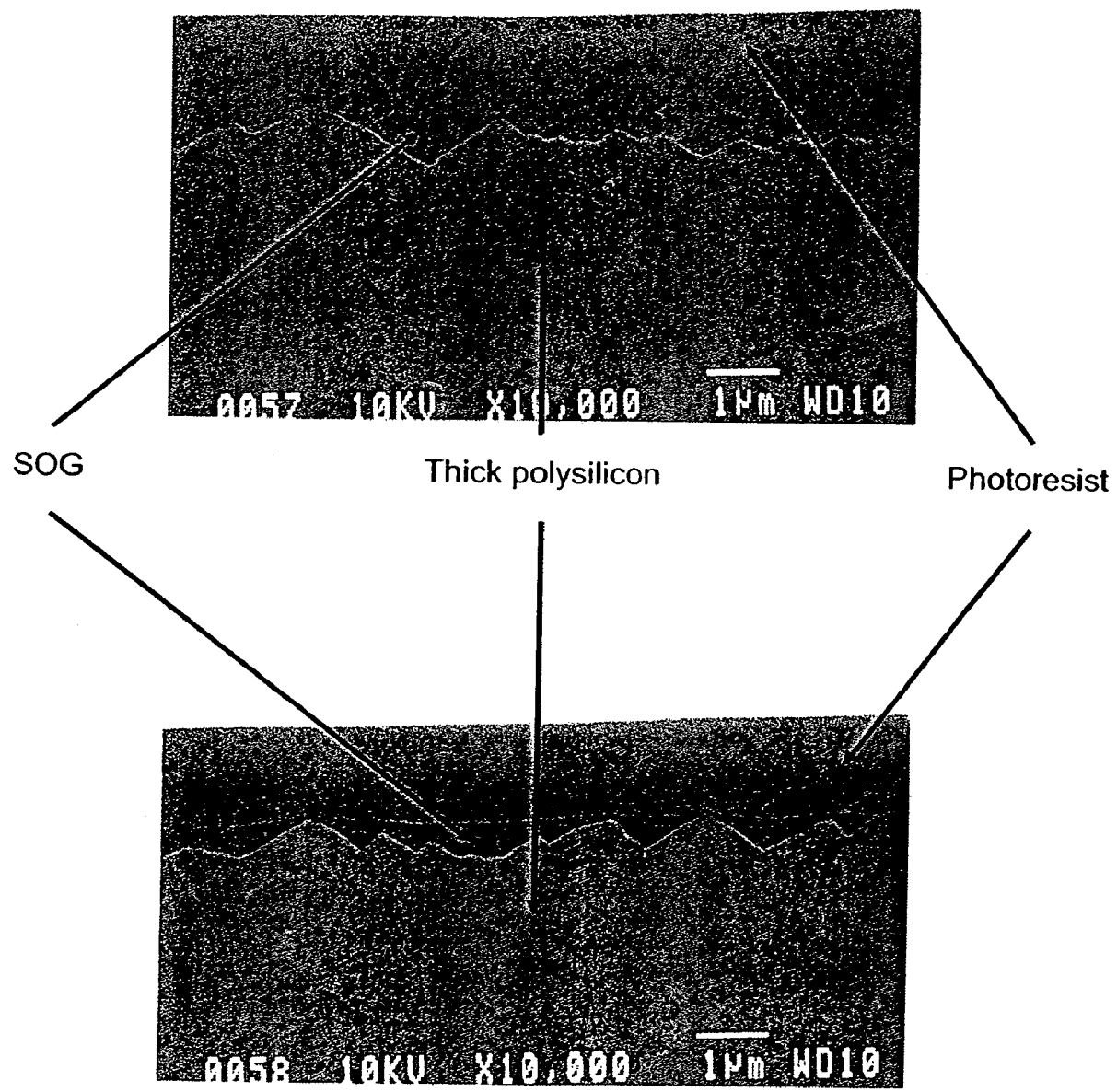
FIG. 11 shows SEM cross-section photographs of the thick polysilicon/SOG/photoresist structure.

FIG. 11 shows two scanning electron microscope, SEM, cross-sections of the (11 μm thick polysilicon/4 coats of Accuglass P-112A/2 µm thick photoresist) structure. It is clear that the low-reflectance SOG layer has reduced the facets of the high-reflectance pyramids to a slightly waving surface, which is much less prone to parasitic light scattering. The combination of a low-reflectance SOG interface with the bottom surface of the photoresist and of a much smoother interface permits a photoresist exposure free from parasitic light scattering and results in a well controlled photoresist and thick polysilicon lithography.

Example Using a Deep Silicon Etch Process

The demonstration of the well controlled photoresist and thick polysilicon lithography was performed with a commercial system available from Alcatel Vacuum Products. This system is called the 'AMS 200 "I-Speeder"'. It is described at the following location: http://www.alcatelvacuum.com/alcatel_avt/download/docs/prod/doc2prod38. pdf.

The process used to perform the demonstration was selected from one of the three processes available from Alcatel for this equipment, namely the "Bosch" room temperature process; the Alcatel cryogenic process; and the standard "non pulsed" process.

The "Bosch" room temperature process was randomly selected from this list of available processes from Alcatel to perform the deep vertical silicon etch of an 11 µm thick polysilicon layer with four coats of Accuglass P-112A/2 µm thick photoresist structure.

Figure 12:
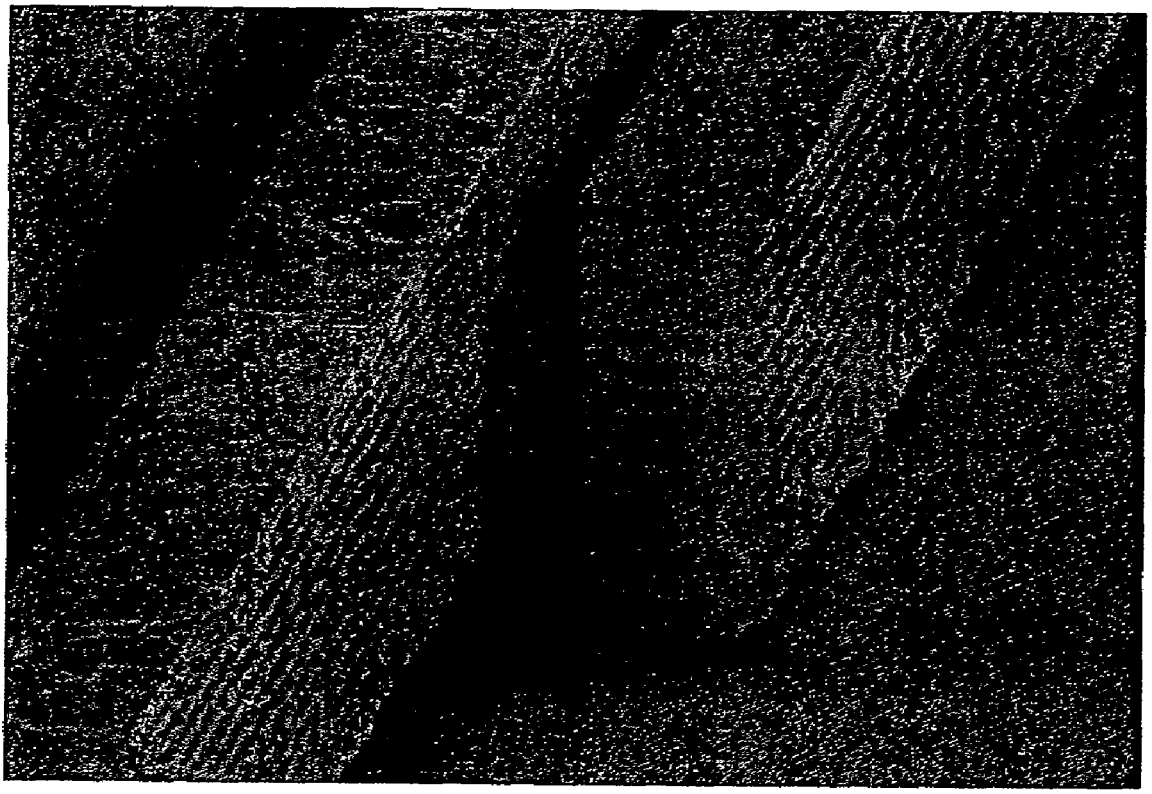
FIG. 12 is an SEM picture of Robert Bosch GmbH's reported lateral surface roughness achieved with the 'Bosch' room temperature process (http://www.europractice-.bosch.com/en/silicon/index.htm)

The "Bosch" room temperature process described in U.S. Pat. No. 5,501,893 entitled 'Method of anisotropically etching silicon' and using an alternating $SF_6$ etching gas and $C_4F_8$ passivation gas results in a wavy lateral silicon surface such as the one shown in FIG. 12. This is reported by Robert Bosch GmbH in the following reference: http://www.europractice.bosch.com/en/silicon/index.htm.

It is then to be expected that the deep silicon etch of the novel (11 µm thick polysilicon/4 coats of Accuglass P-112A/2 µm thick photoresist) structure using the "Bosch" room temperature process should result in a similar wavy lateral silicon surface and that the SOG layer should provide a well controlled photoresist and thick polysilicon lithography.

Demonstration of Precision Lithography of Thick Polysilicon Using Accuglass P-112A SOG Following deposition by LPCVD, an 11 µm thick polysilicon layer was stress-relieved at about 1100° C. in nitrogen prior being coated with coats of Accuglass P-112A SOG, and then treated in nitrogen at about 450° C. prior being coated with a 2 µm thick photoresist layer.

The photoresist layer is applied and exposed using a precision MEMS device pattern and a Canon Mark IV G-line 5× stepper. Following development of the photoresist in the exposed areas, a dry oxide etch was performed in a standard Applied Materials Precision 5000 reactive ion etcher (RIE) in order to remove the SOG layer in these exposed regions of the pattern where the underlying thick polysilicon is to be deep-etched with a vertical profile using the "Bosch" room temperature process in Alcatel's AMS 200 "I-Speeder" anisotropic etcher.

Figure 13:
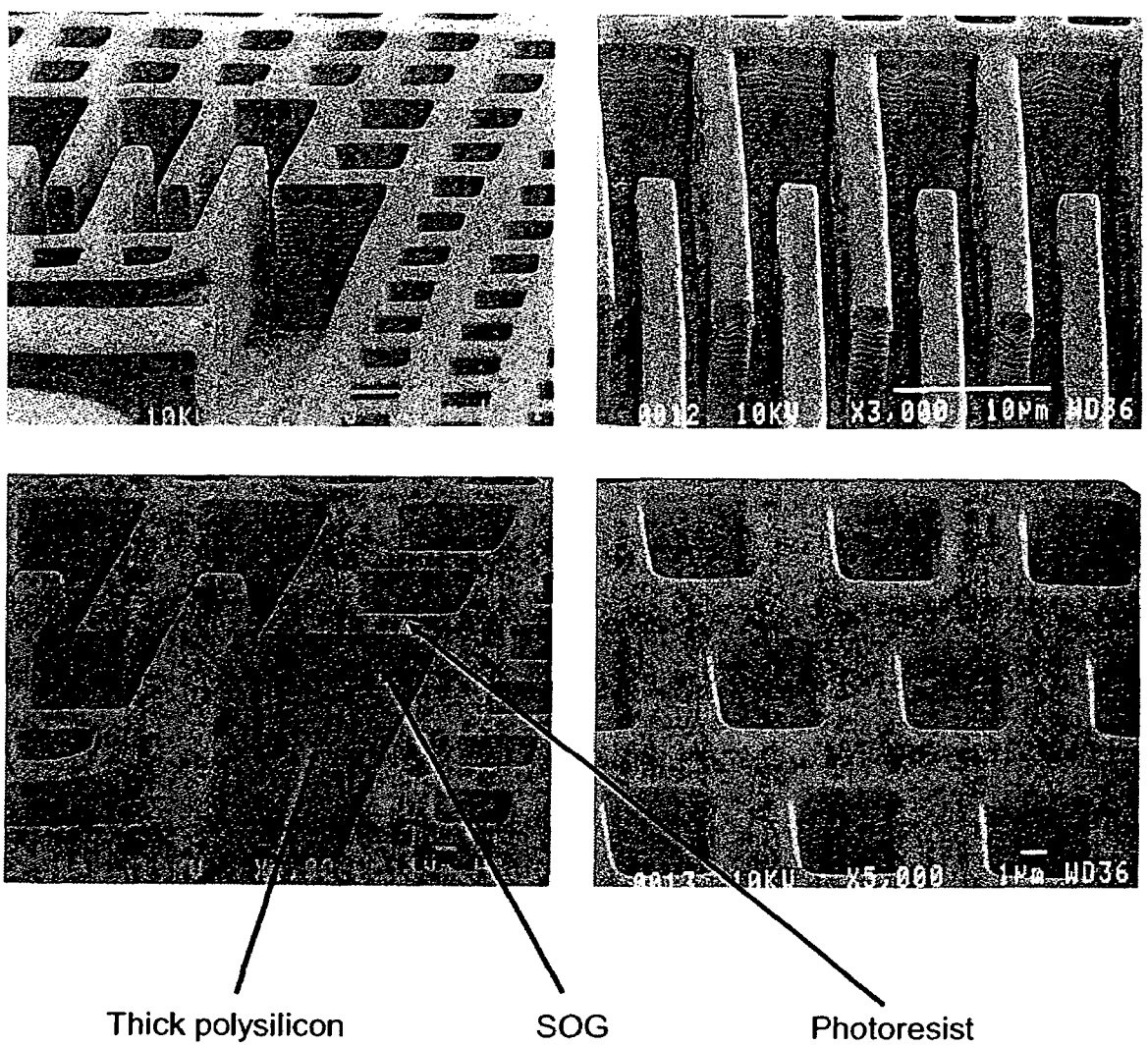
FIG. 13 shows SEM pictures at four locations and magnifications of the thick polysilicon deep-etch through the thick polysilicon/SOG/photoresist structure before photoresist removal.

FIG. 13 shows the resulting deep-etch of the thick polysilicon using four SEM pictures taken at various locations and magnifications. The photoresist has not yet been removed, and the as-etched (11 µm thick polysilicon/4 coats of Accuglass P-112A/2 µm thick photoresist) structure is shown. As expected, the result is an extremely well controlled photoresist and thick polysilicon lithography with the characteristic wavy lateral silicon surface observed on the sidewalls of the deep-etched patterns. These excellent results demonstrate that the SOG achieved the goal and allowed the precise exposure of the photoresist and the precise lithography of the underlying thick polysilicon.

Figure 14:
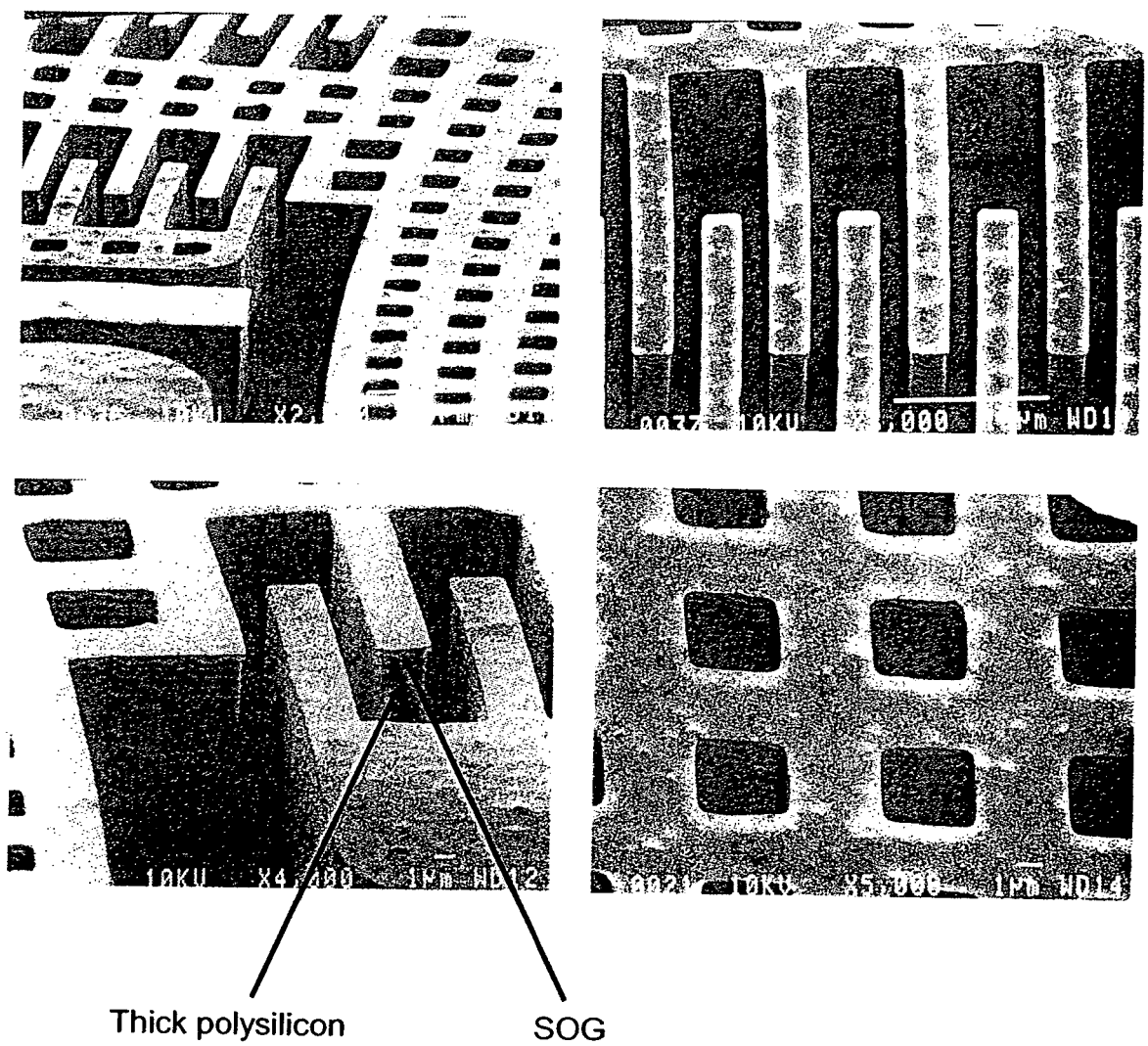
FIG. 14 shows SEM pictures at four locations and magnifications of the thick polysilicon deep-etch through the thick polysilicon/SOG/photoresist structure after photoresist removal)

FIG. 14 shows the resulting deep-etch of the thick polysilicon at the same locations and magnifications of the same wafer following photoresist removal. These photographs showing the (11 µm thick polysilicon/4 coats of Accuglass P-112A) structure again show an extremely well controlled thick polysilicon lithography with the characteristic wavy lateral silicon surface observed on the sidewalls of the deep-etched patterns. These excellent results again demonstrate that the SOG achieved the goal and allowed the precise exposure of the photoresist and the precise lithography of the underlying thick polysilicon.

Figure 15:
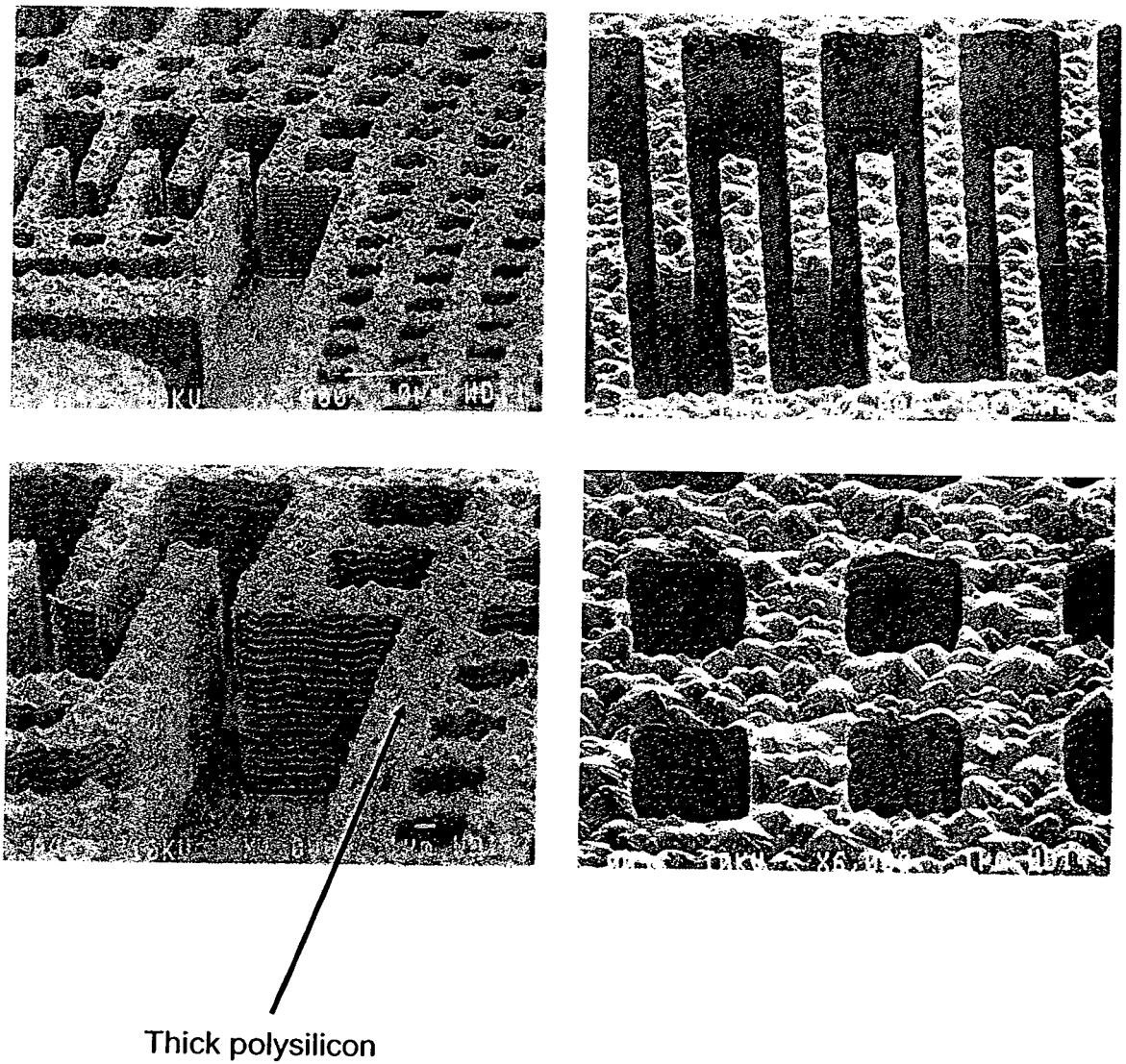
FIG. 15 shows SEM pictures at four locations and magnifications of the thick polysilicon deep-etch through the thick polysilicon/SOG/photoresist structure after release (SOG is also removed during release)
Figure 16:
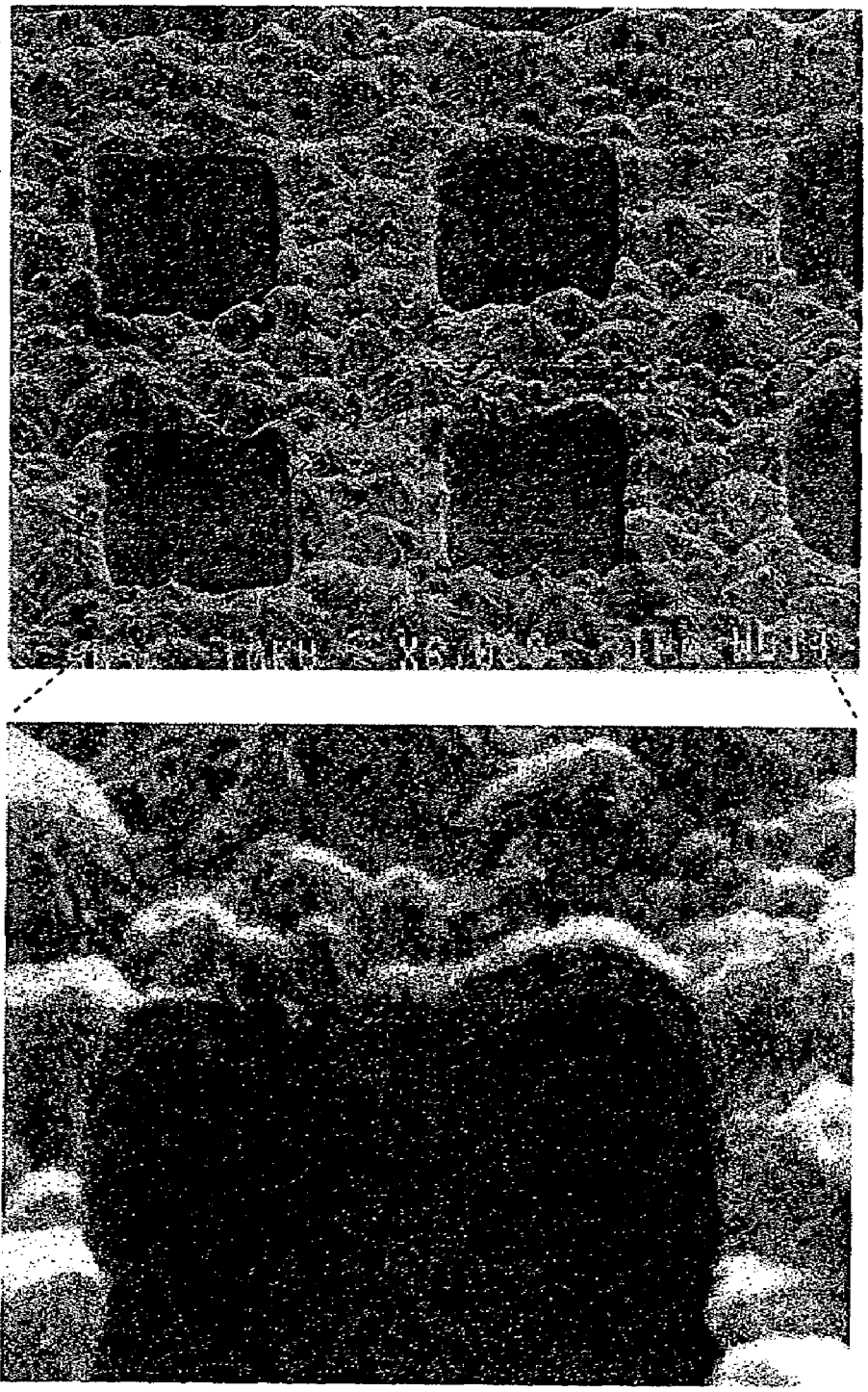
FIG. 16 shows SEM pictures of the precise lithography achieved over the rough surface of the thick polysilicon using the thick polysilicon/SOG/photoresist structure after release (SOG is also removed during release).

FIG. 15 shows the resulting deep-etch of the thick polysilicon at the same locations and magnifications of the same wafer following the release of the thick polysilicon from its underlying sacrificial material. These photographs showing the released 11 µm thick polysilicon again show extremely well controlled thick polysilicon lithography with the characteristic wavy lateral silicon surface observed on the sidewalls of the deep-etched patterns. These excellent results again demonstrate that the SOG achieved the goal and allowed the precise exposure of the photoresist and the precise lithography of the underlying thick polysilicon.

FIG. 15 shows the achieved lithography on the rough surface of the stress-relieved and released thick polysilicon. The SOG allowed extremely precise lithography of the thick polysilicon without any machining of the surface of the thick polysilicon, which remains at its full thickness at all locations. This important feature eliminates the undesirable local thickness variation associated with prior art MEMS fabrication techniques involving photoresist etch-back and/or chemical-mechanical polishing.

The result is a low-cost, wide process window and high performance MEMS fabrication process providing users a forgiving set of design rules for sensors and actuators because the thick suspended rough surface polysilicon has upward microscopic pyramids whose sizes are much smaller than the typical dimensions of the components patterned in the suspended thick polysilicon.

The novel process can provide reproducible electrostatic actuators since it has much more uniform thickness over the dimensions of these typical components because the random distribution of the surface roughness results in a uniform average thickness of patterned components. The vertical electrodes formed by two neighbouring and facing-each-other deep-etched thick polysilicon surfaces (over or not local topology) result in a parallel plate capacitor of repeatable net surface area and hence repeatable capacitance value since the inter-electrode spacing is also achieved by this precise lithography process.

The novel process can also provide repeatable mechanical elements since the average thickness of deep-etched thick polysilicon is not affected by the underlying topology;

Since the surface roughness of the thick polysilicon is increasing with deposited thickness, the number of coats of SOG can be different from four (4) and is a function of the thickness of the thick polysilicon to be precisely patterned and of deposition technique used to deposit it. The number of coats can be as low as one (1) for polysilicon as thin as 0.5 µm and as high as ten (10) or more for polysilicon as thick as 100 µm.

Although a phosphorus-doped silicate-based Accuglass P-112A SOG is preferred, it can be replaced by a different SOG providing thinner or thicker films per applied coating; undoped layers or layers doped with elements different than phosphorus; methyl-based, ethyl-based or other semi-organic layers achieved by non-silicate based SOG.

The SOG can be replaced by a another non-photosensitive spin-on material such as a silsesquioxane, a polyimide, a spin-on antireflective layer such as a DARC layer from Brewer Sciences or an organic or semi-organic material optically resistant to the upper-photoresist exposure.

The etch of the spin-on material in the exposed and developed regions could be: performed in another dry etch equipment than the Applied Materials Precision 5000 reactive ion etcher, RIE; or performed in wet-etch equipment.

The polysilicon to be patterned can be deposited by a number of techniques. For example, it can be deposited in an epitaxial reactor, a horizontal LPCVD tube, a vertical LPCVD tube, a PECVD equipment, a MOCVD equipment, a cluster tool, a batch equipment or a single wafer equipment.

The number of polysilicon levels patterned with this new technique can preferably ranges between one (1) and ten (10).

The stress-relieving of polysilicon can be performed in different conditions as to enhance its performance; or eliminated if the patterned polysilicon does not require to be released.

The 2 µm thick photoresist could be thinner or thicker than 2 µm, preferably in the range between 1.0 µm and 500 µm; a G-line, I-line or X-ray photoresist; use a dye to minimize parasitic light reflection; and use an adhesion promoter.

The thick polysilicon could be exposed using 1×, 5×, 10× or 20×, G-line, I-line or X-ray exposure equipment.

The Alcatel 'AMS 200 "I-Speeder"' could be replaced by another Alcatel deep silicon etcher such as the Alcatel 601 E or the like; an STS, a Plasmatherm, an Oxford Instruments or another deep silicon etch from another manufacturer;

The "Bosch" room temperature deep silicon etch process used for this demonstration and resulting in the wavy surface of the polysilicon lateral walls can be replaced by another vertical deep-silicon etch process such as:

The Alcatel cryogenic process

The standard "non pulsed" process;

Any other process providing a deep vertical etch.

It could also be replaced by a TMAH-based, a KOH-based or any other wet anisotropic etch process; or an isotropic etch.

The MEMS is not limited to an electrostatic actuated device but could, for example, be: a micro-sensor; a micro-actuator; a mechanical MEMS; an electrical MEMS; a thermal MEMS; a photonics MEMS (MOEMS); a biological MEMS (biochip); or a combination of the above.

It will be apparent to one skilled in the art that many other variants of the invention are possible within the scope of the appended claims.

I claim:

1. A microstructure component for a MEMS device, comprising:
    a polysilicon bulk layer having a thickness greater than 0.5 µm and less than 100 µm, said bulk layer being deposited on an underlying sacrificial layer, and said bulk layer having an upper surface with a surface roughness created by a series of randomly shaped pyramids of random height causing local variations in the thickness of the bulk layer;
    at least one layer of photo-insensitive spin-on planarizing material deposited directly on said upper surface so as to be in contact therewith and smooth out said surface roughness created by said pyramids;
    a photoresist layer deposited directly on said planarizing material so as to be in contact therewith; and
    a deep etch trench extending through said photoresist layer to said underlying sacrificial layer.

2. A microstructure as claimed in claim 1, wherein said planarizing material is spin-on glass.

3. A microstructure as claimed in claim 2, wherein said spin-on glass is inorganic spin-on glass.

4. A microstructure as claimed in claim 3, wherein said spin-on glass is a phosphorus-doped silicate-based spin-on glass.

5. A microstructure as claimed in claim 2, wherein said spin-on glass is selected from the group consisting of: methyl-based, ethyl-based or other semi-organic spin-on glass.

6. A microstructure as claimed in claim 1, wherein said planarizing material is selected from the group consisting of: silsesquioxane, polyimide, a spin-on antireflective layer; or an organic or semi-organic material optically resistant to exposure of said photoresist layer.

7. A microstructure as claimed in claim 1, comprising multiple layers of said planarizing material.

8. A microstructure as claimed in claim 1, wherein the thickness of the photoresist layer lies in the range 1.0 µm to 500 µm.

9. A microstructure as claimed in claim 7, wherein the thickness of said polysilicon layer is about 11 µm.

10. A microstructure as claimed in claim 1, wherein a bottom surface of said bulk layer is flat and straight.

* * * * *